(12) United States Patent
Kripanidhi et al.

(10) Patent No.: US 9,437,293 B1
(45) Date of Patent: Sep. 6, 2016

(54) INTEGRATED SETBACK READ WITH REDUCED SNAPBACK DISTURB

(71) Applicant: Intel Corporation, Santa Clara, CA (US)

(72) Inventors: Arjun Kripanidhi, Mountain View, CA (US); Kiran Pangal, Fremont, CA (US); Lark-Hoon Leem, East Palo Alto, CA (US); Balaji Srinivasan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/671,471

(22) Filed: Mar. 27, 2015

(51) Int. Cl.
*G11C 7/04* (2006.01)
*G11C 13/00* (2006.01)

(52) U.S. Cl.
CPC ......... *G11C 13/004* (2013.01); *G11C 13/0004* (2013.01); *G11C 13/0033* (2013.01)

(58) Field of Classification Search
CPC ..... G11C 7/067; G11C 7/06; G11C 13/0004; G11C 13/0026; G11C 13/0033; G11C 13/0007; G11C 13/0011; G11C 13/0028; G11C 13/004; G11C 13/0069
See application file for complete search history.

(56) References Cited

U.S. PATENT DOCUMENTS

| | | | |
|---|---|---|---|
| 6,914,255 B2 * | 7/2005 | Lowrey | G11C 13/0004 257/2 |
| 7,983,065 B2 * | 7/2011 | Samachisa | B82Y 10/00 365/130 |
| 2007/0247196 A1 | 10/2007 | Niedermeier et al. | |
| 2008/0025079 A1 | 1/2008 | Philipp et al. | |
| 2008/0165570 A1 | 7/2008 | Happ et al. | |
| 2010/0149857 A1 | 6/2010 | Tang | |
| 2011/0134685 A1 | 6/2011 | Kau et al. | |
| 2015/0262661 A1 | 9/2015 | Chu et al. | |

OTHER PUBLICATIONS

International Search Report and Written Opinion mailed Jun. 8, 2016, issued in corresponding International Application No. PCT/US2016/017870, 10 pages.

* cited by examiner

*Primary Examiner* — Andrew Q Tran
(74) *Attorney, Agent, or Firm* — Schwabe, Williamson & Wyatt, P.C.

(57) ABSTRACT

Embodiments of the present disclosure describe read and write operations in phase change memory to reduce snapback disturb. In an embodiment, an apparatus includes read circuitry to apply a read voltage to a phase change memory (PCM) cell, setback circuitry to apply a setback pulse to the PCM cell in response to the application of the read voltage, wherein the setback pulse is a shorter set pulse performed for a first period of time that is shorter than a second period of time for a regular set pulse that is configured to transition the PCM cell from an amorphous state to a crystalline state, sense circuitry to sense, concurrently with application of the setback pulse, whether the PCM cell is in the amorphous state or the crystalline state. Other embodiments may be described and/or claimed.

21 Claims, 7 Drawing Sheets

INTEGRATED SETBACK READ WITH REDUCED SNAPBACK DISTURB

FIELD

Embodiments of the present disclosure generally relate to the field of integrated circuits, and more particularly, to read and write operations in phase change memory to reduce snapback disturb.

BACKGROUND

Phase change memory (PCM) technology such as multi-stack cross-point PCM is a promising alternative to other non-volatile (NV) memory technology. Presently, read disturb (or weak programming) of a cell during read operation due to snapback discharge effect is a fundamental risk to PCM devices. For example, a read operation may be performed to differentiate states of the cell. However, a first state of the cell may be disturbed or weakly programmed to a second state due to snapback discharge effect during read. Emerging solutions include mitigating read disturb by reducing cell capacitance during read to limit current through the cell during read to be short and therefore limit cell heating. However, in such technique, an effective cell capacitance may define a sense margin resulting in a trade-off between read disturb and sense margin. Additionally, due to cell scaling to smaller dimensions, thermal latency is expected to scale resulting in an increase of array capacitance due to larger tiles to have same array efficiency and due to cell pitch reduction.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe read and write operations in phase change memory to reduce snapback disturb. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Figure 1:
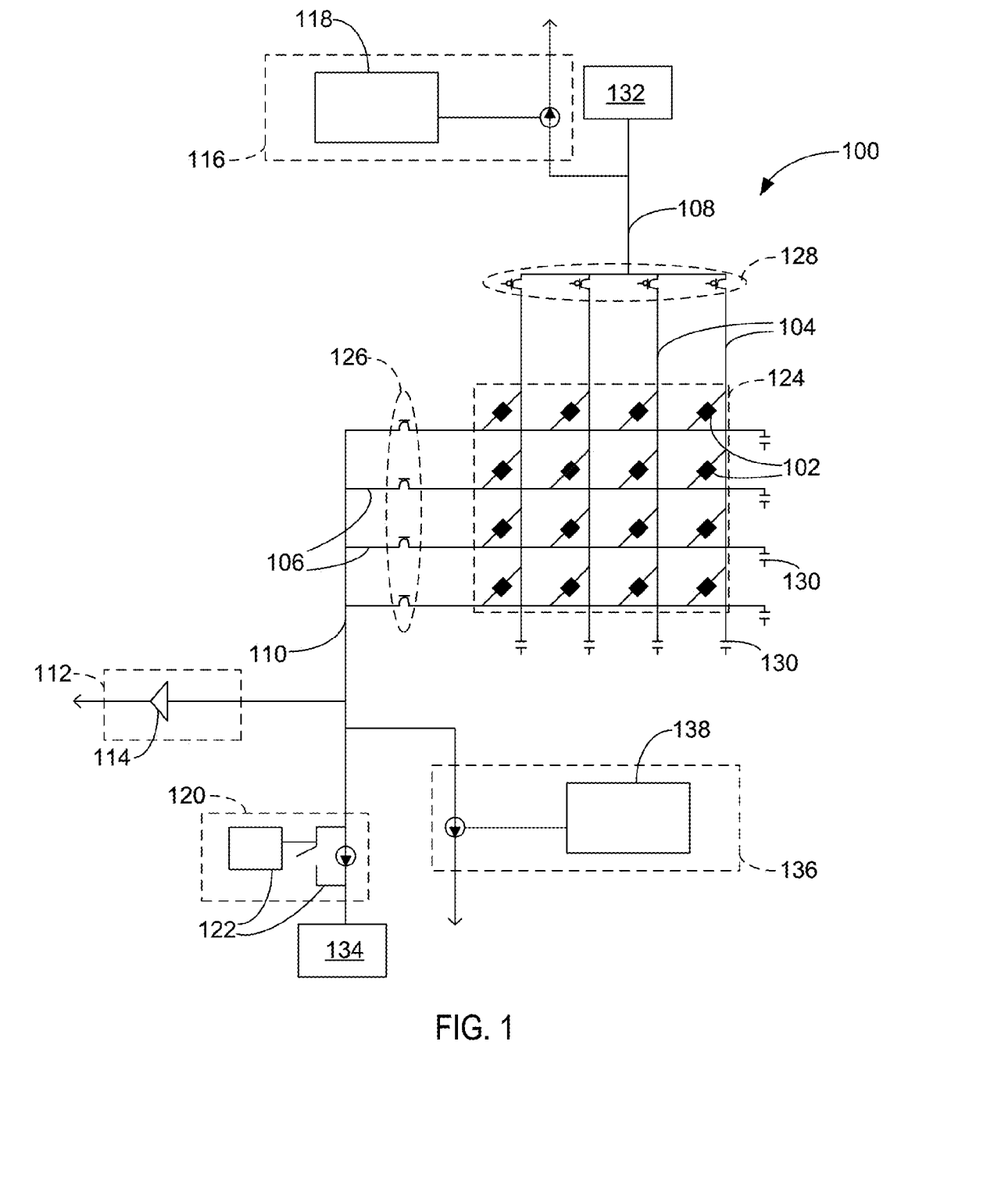
FIG. 1 schematically illustrates example circuitry of a phase change memory (PCM) device, in accordance with some embodiments.

FIG. 1 schematically illustrates example circuitry 100 of a phase change memory (PCM) device in accordance with some embodiments. According to various embodiments, the circuitry 100 may include one or more phase change memory (PCM) cells 102, which may be configured in an array as shown. The PCM cells 102 may include, for example, a phase change material such as a chalcogenide glass that can be switched between crystalline and amorphous states with the application of heat produced by an electric current. The state (e.g., crystalline/amorphous) of the phase change material may correspond with a logical value or state (e.g., 1 or 0) of the PCM cells 102. The circuitry 100 may be part of a phase change memory and switch (PCMS) device in some embodiments. The PCM cells 102 may include a switch such as, for example, an ovonic threshold switch (OTS) configured for use in selection/programming operations of the PCM cells 102. The circuitry 100 may be part of other suitable types of memory devices that benefit from the principles described herein.

The circuitry 100 may further include one or more bit-lines (hereinafter "bit-lines 104") and one or more word-lines (hereinafter "word-lines 106") coupled to the PCM cells 102, as can be seen. The bit-lines 104 and word-lines 106 may be configured such that each of the PCM cells 102 is disposed at an intersection of each individual bit-line and word-line. A voltage or bias can be applied to a target memory cell of the PCM cells 102 using the word-lines 106 and the bit-lines 104 to select the target cell for a read or write operation. Bit-line drivers 128 may be coupled to the bit-lines 104 and word-line drivers 126 may be coupled to the word-lines 106 to facilitate decoding/selection of the one or more PCM cells 102, as shown. Capacitors 130 and resistors (not shown) may be coupled to the bit-lines 104 and the word-lines 106, as can be seen. The capacitors 130 may represent parasitic elements in one or more embodiments.

The circuitry 100 may include one or more tiles 124. The one or more tiles 124 may comprise a portion of the array of one or more word-lines 106, bit-lines 104, and PCM cells 102 that is treated as a discrete unit during a selection operation of a target memory cell. That is, in some embodiments, each of the one or more tiles 124 is a unit of the array that is biased to select the target memory cell (e.g., a bit) in the array. In the depicted embodiment, the one or more tiles 124 comprise an array of four word-lines and four bit-lines (4 WL×4 BL); however, other tile sizes can be used in other embodiments including, for example, a tile size of one thousand word-lines by one thousand bit-lines (1000 WL×1000 BL). The one or more tiles 124 may be part of any memory layer of a stacked memory configuration in some embodiments. For example, the one or more tiles 124 may be part of a memory layer formed on another memory layer, in some embodiments.

The bit-lines 104 may be coupled to a bit-line electrode 108, which may be further coupled to a bit-line supply 132 that is configured to provide an electrical supply for the bit-lines 104. The word-lines 106 may be coupled to a word-line electrode 110, which may be further coupled to a word-line supply 134 that is configured to provide an electrical supply for the word-lines 106. The bit-line electrode 108 and the word-line electrode 110 may each be a current path to the PCM cells 102. The word-line drivers 126 and the bit-line drivers 128 may each comprise single or multiple transistors per electrode according to various embodiments. For embodiments where multiple transistors are used for each of the word-line drivers 126 and the bit-line drivers 128, the multiple transistors may be coupled to additional voltage supplies using additional word-line and/or bit-line electrodes that may similarly comport with embodiments described herein.

The circuitry 100 may include sense circuitry 112 (which may also be referred to as or be a part of "read circuitry") coupled to the word-line electrode 110. The sense circuitry 112 may use the word-line electrode 110 as an electrical node for performing a read operation, such as a sense operation, of the PCM cells 102. In one embodiment, the sense circuitry 112 comprises a voltage comparator 114. For example, the sense circuitry 112 may include a word-line load connected to the word-line electrode 110 to convert a current on the word-line electrode 110 to a voltage that is a first input to the voltage comparator 114. An equivalent word-line load may be connected to a reference current (not shown) to provide a voltage that is a second input to the voltage comparator 114. When a particular word-line and bit-line are selected in the array, the word-line load on the word-line electrode 110 may convert the current on the selected bit-line to a voltage. Leakage components of the current can be mitigated by respectively selecting a bias for all other unselected word-lines and bit-lines that reduces or minimizes leakage. Capacitive components of the current can be mitigated by allowing sufficient time for the capacitive components to dissipate. The current that is converted to the first input to the voltage comparator 114 may correspond with the current of the target memory cell. The reference current may be selected such that the current of the target memory cell is lower than the reference current before snapback of the target memory cell and higher than the reference current after snapback of the target memory cell. In this manner, an output of the voltage comparator 114 may be indicative of a state of the target memory cell. A latch (not shown) may be coupled to the voltage comparator 114 to store information associated with the read operation.

The circuitry 100 may further include write circuitry 116 coupled to the bit-line electrode 108. The write circuitry 116 may use the bit-line electrode 108 as an electrical node for performing a write operation, such as a set or reset operation, of the PCM cells 102. The write circuitry 116 may include a current profile generator 118 that generates a current (e.g., a current pulse) for performing the write operation. According to various embodiments, the current profile may be generated such that the current in conjunction with transient/parasitic currents and/or oscillations between an on-state and off-state of the memory cell is configured to set or reset the memory cell.

The circuitry 100 may further include components of a selection module 120 coupled to the word-line electrode 110. Current-limiting circuitry 122 of the selection module 120 may be coupled to the word-line electrode 110 to facilitate a selection operation of the PCM cells 102 using the word-line electrode 110. The selection operation may precede a read/write operation and place the target memory cell in a state to receive a read/write operation. During selection, a target memory cell may be moved from a subthreshold region of operation to a region of operation above a threshold region of operation by applying a voltage/bias across the target memory cell. The voltage bias to achieve selection of the target cell is provided by word-line and bit-line driver circuitry (e.g., which may be part of the selection module 120 in some embodiments) of the respective target word-line and the target bit-line in conjunction with the current-limiting circuitry 122. The target word-line bias and the target bit-line bias may be designed or selected such that, in combination, an overall bias is applied across the target cell that is sufficient to bring the target memory cell above a threshold voltage. In the present example, "above the threshold voltage" may refer to a region of operation of a target memory cell that is capable of conducting sufficient current for a write operation, although a smaller current may maintain the target cell in the region of operation. The transition from subthreshold to the threshold or above threshold region may involve a "snapback" event where the voltage sustained by the target cell for a given current through the cell is suddenly reduced. The current-limiting circuitry 122 may limit or control the current of the word-line electrode 110 to prevent damaging the target memory cell with excessive current. That is, limiting the maximum current of the word-line electrode 110 may also limit the maximum current through the one or more PCM cells 102.

In an embodiment, the current-limiting circuitry 122 comprises a current mirror circuit. The current-limiting circuitry 122 may comprise a transistor gate that is configured to limit a current of the word-line electrode 110 to a maximum current level. For example, the transistor may be an n-type transistor having a gate that is controlled to an analog level such that the transistor delivers up to a maximum desired current. The current-limiting circuitry 122 may be enabled by applying a gate voltage to the transistor. The selection module 120 may include additional control circuitry to facilitate decoding of a target memory cell of the one or more PCM cells 102 such that the target memory cell is moved from a subthreshold region of operation to a region of operation above a threshold region of operation, the threshold being a function of current.

In some embodiments, the circuitry 100 includes setback circuitry 136 such as, for example, a setback module. The setback circuitry 136 may include, for example, a current profile generator 138 that generates a current (e.g., a current pulse) for performing a setback operation such as applying a setback pulse as described herein. In the depicted embodiment, the setback circuitry 136 is coupled with the word-line electrode 110. In other embodiments, the setback circuitry 136 may be integrated with the sense/read circuitry 112 or with the write circuitry 116 to supply current to the PCM cell.

According to various embodiments, the sense/read circuitry 112, the write circuitry 116, the selection module 120, and/or the setback circuitry 136 may be part of other suitable circuitry or modules than described. For example, in some embodiments, the features 112, 116, 120, and/or 136 may be suitably combined in one or more modules or may be coupled with the other of the bit-line electrode 108 and/or word-line electrode 110 than depicted. The circuitry 100 may be configured to perform actions described herein, according to various embodiments. For example, the circuitry 100 (e.g., one or more control modules) may be configured to perform actions of integrated setback read, according to embodiments described herein.

Figure 2:
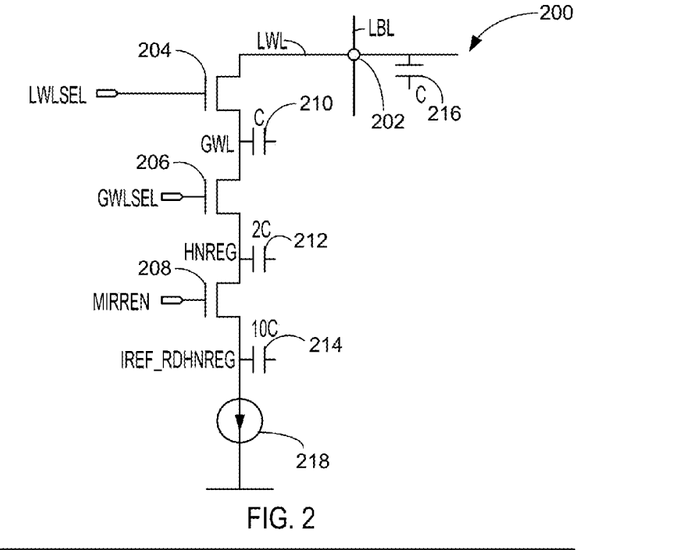
FIG. 2 schematically illustrates example circuitry corresponding with a PCM cell of a PCM device, in accordance with some embodiments.

FIG. 2 schematically illustrates example circuitry 200 corresponding with a PCM cell 202 (e.g., one of the PCM cells 102 of FIG. 1) of a PCM device, in accordance with some embodiments. The PCM cell 202 may include a phase change material and a cell selector such as an ovonic threshold switch (OTS) coupled with a local word-line (LWL) node and a local bit-line (LBL) node, as can be seen, to provide a PCMS cell. The LWL node and the LBL node may represent an individual word-line of the word-lines 106 of FIG. 1 and an individual bit-line of the bit-lines 104 of FIG. 1, respectively.

According to some embodiments, one or more transistors and/or capacitors may be coupled with the LWL node. For example, in the depicted embodiment, as can be seen, transistor 204 may be coupled with the LWL node and an LWL select (LWLSEL) node. A global word-line (GWL) may be coupled with the transistor 204 and transistor 206 may be coupled with the GWL node. A global word-line select (GWLSEL) node may be coupled with the transistor 206. A negative regulated supply node (HNREG node) may be coupled with the transistor 206 and transistor 208 may be coupled with the HNREG node. The HNREG node may be used as a sense node in some embodiments. For example, the HNREG node may be used as an input for a sense amp comparator. A current mirror enable node (MIRREN node) may be coupled with the transistor 208, which may be a current mirror enable transistor. The MIRREN node may connect the PCM cell to a current mirror. A current source node (IREF_RDHNREG node) may be coupled with the transistor 208. The IREF_RDHNREG node may connect to current source 218 to provide or control (e.g., limit) a setback current through the PCM cell during setback operation. Capacitor 210 with capacitance C may be coupled with the GWL node, capacitor 212 with capacitance ~2C may be coupled with the HNREG node and capacitor 214 with capacitance ~10C may be coupled with the IREF_RDHN-REG. Capacitor 216 with capacitance C may be coupled with the LWL node. Current source 218 may be coupled with the IREF_RDHNREG node.

During a read operation with integrated setback, the LWLSEL transistor 204 may control snap back discharge during a read pulse and current source 218 may provide/control current during the integrated setback pulse with a current configured to set the PCM cell back to crystalline state. A measured voltage of the HNREG node may be fed into a sensing circuit, which may determine if the PCM cell was in crystalline or amorphous state. In some embodiments, the LWLSEL node may be limited by pulling the gate of transistor 204 (which may be coupled with the PCM cell, as can be seen) low during a snapback event of a read operation in order to reduce discharge of capacitors (e.g., capacitors 210, 212, 214) by reducing and/or isolating capacitance on GWL and HNREG nodes from the PCM cell.

Figure 3:
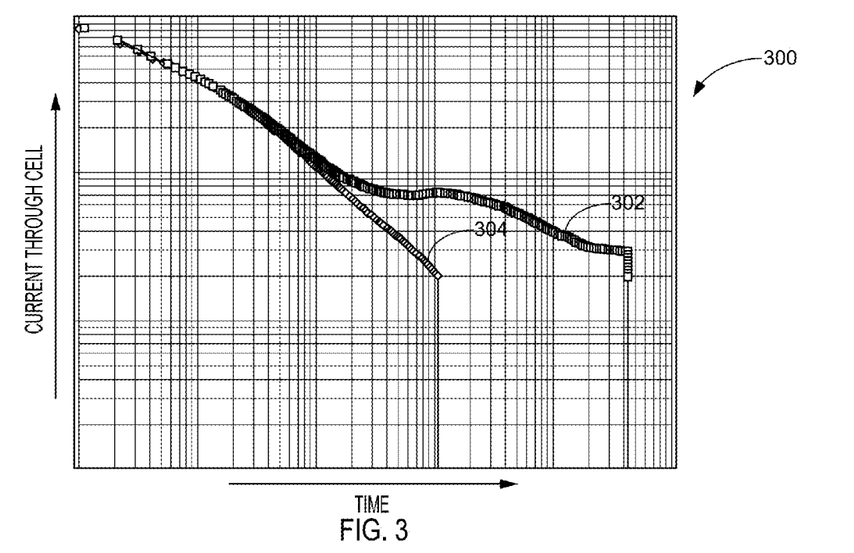
FIG. 3 is a graph depicting a memory cell read current profile for integrated setback read and read without integrated setback, in accordance with some embodiments.

FIG. 3 is a graph 300 depicting a memory cell read current profile for integrated setback read and read without integrated setback, in accordance with some embodiments. Current through a target PCM cell over time for integrated setback read is depicted at 302 and current through a target PCM cell over time in log scale for read without integrated setback (e.g., float read) is depicted at 304. As can be seen, initially a snapback current profile may be similar between the integrated setback read at 302 and the read without integrated setback at 304. However, instead of a relatively fast quench at 304 for the read without integrated setback, the integrated setback read at 302 allows additional time for current to pass through the PCM cell and recrystallize the PCM cell. In some embodiments, the integrated setback read at 302 may provide low current through the PCM cell for about 10 times longer than the read without integrated setback at 304. In some embodiments, low current may range from about 20 microamps (μA) to 40 μA. The low current may vary and have other values based on PCM cell size and/or technology node.

Figure 4:
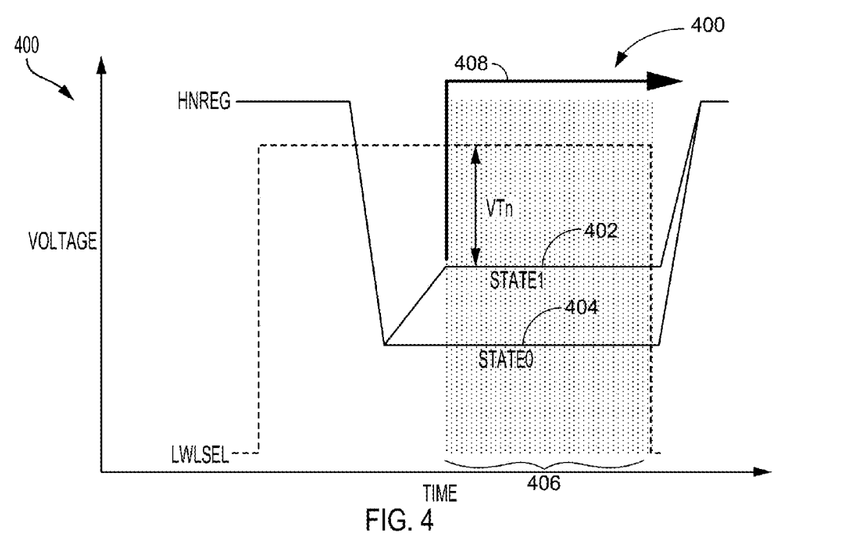
FIG. 4 is a graph depicting voltage profile and timing for various nodes during a read operation, in accordance with some embodiments.

FIG. 4 is a graph 400 depicting voltage profile and timing for various nodes during a read operation, in accordance with some embodiments. During a read operation, an LWL-SEL node (e.g., LWLSEL node of FIG. 2) may be biased with a voltage to turn on a transistor (e.g., transistor 204 of FIG. 2) and build up a voltage bias across the PCM cell (e.g., PCM cell 202 of FIG. 2). A voltage of HNREG node (e.g., HNREG node of FIG. 2) may drop initially and then rise when the PCM cell turns on ("snapped") if the PCM cell is in a crystalline state, as can be seen at 402. A voltage of the LWL node (V(LBL)) may also go down and otherwise follow the HNREG and a voltage of the LBL node (V(LWL)) may be pulled up such that V(LBL)–V(LWL) is equal to a total bias on the PCM cell, which may be a demarcation read voltage (VDM) that is applied during the read operation. However, if the PCM cell is in an amorphous state, the voltage of HNREG node may stay low until the HNREG node is in an off state and the voltage rises again to an initial voltage, as can be seen at 404. In some embodiments, an applied bias such as the VDM of a read pulse may be high enough to only turn on PCM cells in the crystalline state, which may have a lower threshold voltage (Vt) than PCM cells in the amorphous state. In some embodiments, the VDM may be supplied through negative and/or positive regulated nodes. For example, the bit-line electrode 108 of FIG. 1 may be a positive regulated node and the word-line electrode 110 (which may function as HNREG node, in some embodiments) may supply the bias for VDM.

Sense may be performed when the PCM cell in the crystalline state turns on at 402 (e.g., in the shaded region 406 or during the time indicated by arrow 408) before the PCM cell turns off, which may make latency independent of cell shutoff. Sensing may be performed to determine whether the PCM cell is in the crystalline state (e.g., at 402) or the amorphous state (e.g., at 404). Sense circuitry may determine whether the PCM cell is in the crystalline state or the amorphous state based on a measured voltage of the HNREG node. A sense margin may be substantially fixed irrespective of background leakage, which may increase in robustness of the read operation and prevent erroneous detection of state 0 bits being read as state 1. For example, the sense margin may be determined by a threshold voltage of an LWLSEL NMOS transistor (e.g., transistor 204 of FIG. 2). Voltage VTn may represent a difference between the LWLSEL node and the HNREG node when the PCM cell in the crystalline state turns on at 402 (e.g., in the shaded region 406). That is, in some embodiments, a voltage of the HNREG node (VHNREG1) may correspond with a voltage of the LWLSEL node (VWLSEL) minus the voltage VTn. In some embodiments, a voltage of the HNREG node (VHNREG2) when the PCM cell is in the amorphous state may correspond with a voltage of a WLVDM node (VWLVDM). The VWLVDM may be a negative bias voltage applied to the LWL of FIG. 2 through a negative regulator A setback pulse (e.g., shorter write pulse) may be applied to the PCM cell when the PCM cell in the crystalline state turns on at 402 (e.g., in the shaded region 406). For example, a controlled low current may be applied to the PCM cell to help set it back. The setback pulse may be turned off when the voltage of the LWLSEL node goes back down. In some embodiments, PCM cells in the amorphous state may not turn on during the read pulse (e.g., applied bias VDM) and, thus, may not receive the setback pulse.

Figure 5A:
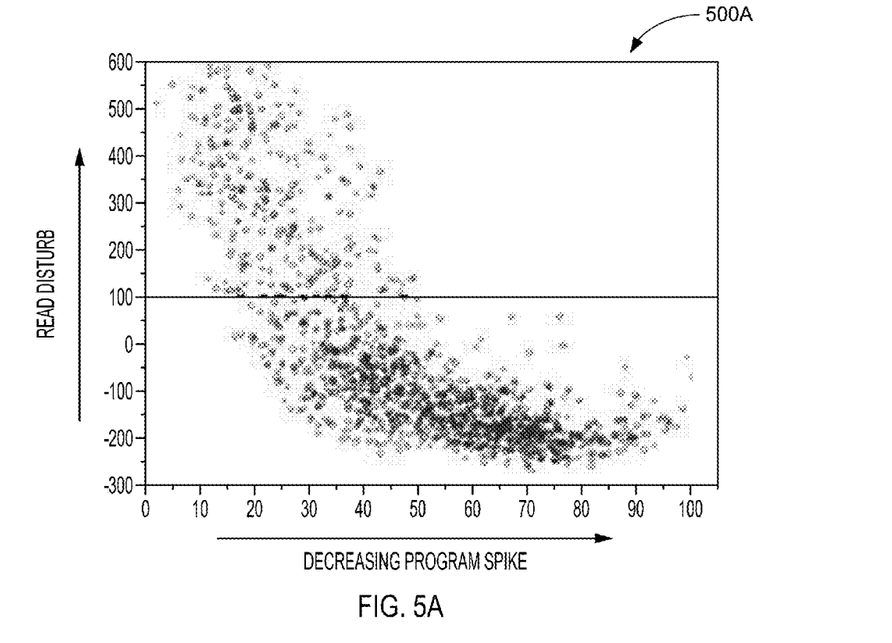
FIGS. 5A-C are graphs depicting read disturb impact for various durations of setback pulse, in accordance with some embodiments.
Figure 5B:
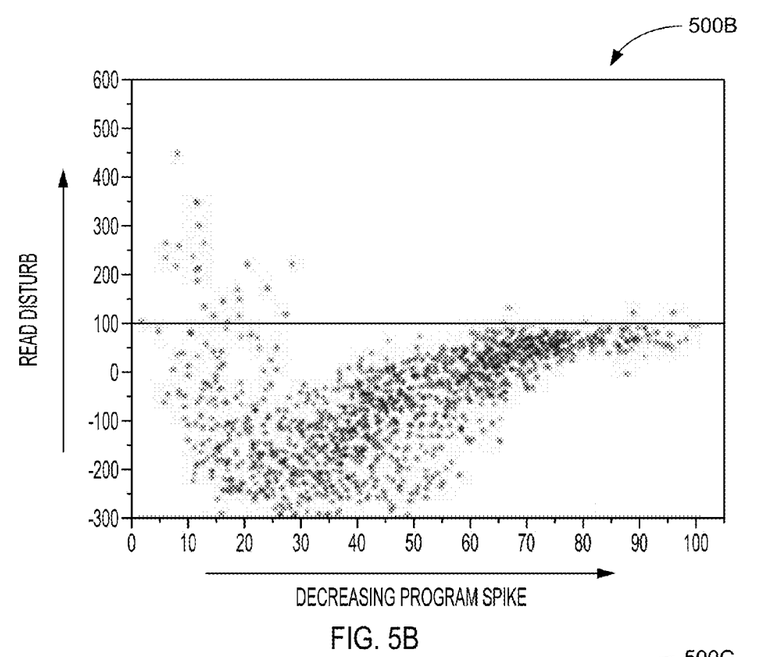
Figure 5C:
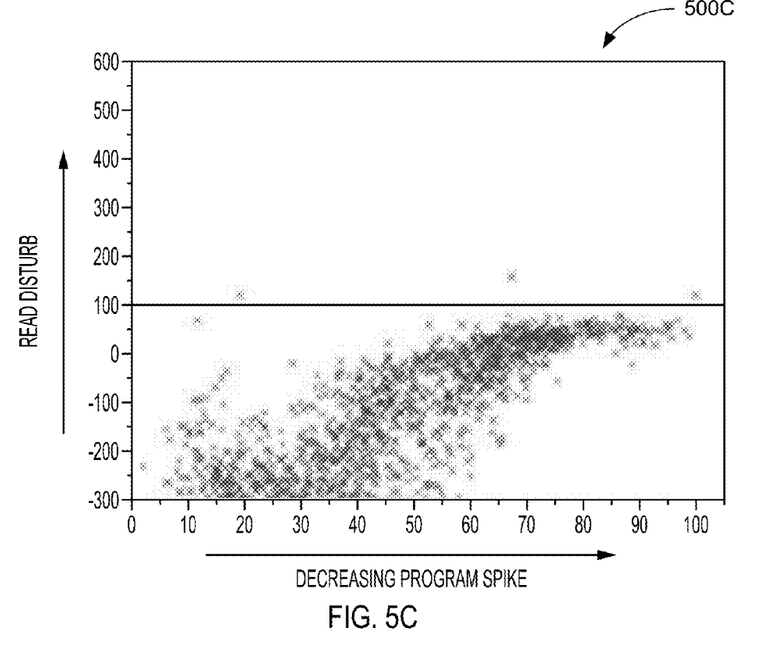

FIGS. 5A-C are graphs depicting read disturb impact for various durations of setback pulse, in accordance with some embodiments. Read disturb in millivolts (mV) is depicted on the vertical axis with 100 mV representing an example level above which an unacceptable level of read disturb occurs and below which an acceptable level of read disturb occurs. A decreasing program spike is depicted on the horizontal axis in percentage (%) with 0 being worst and 100 being best. Each point on the graphs represents read disturb of a different PCM cell of a PCM device.

FIG. 5A includes a graph 500A depicting read disturb impact for a read operation without setback pulse. Approximately 50% of the PCM cells of graph 500A have a read disturb below 100 mV.

FIG. 5B includes a graph 500B depicting read disturb impact for a read operation with a setback pulse (e.g., shorter write pulse) that is $1/100^{th}$ of a regular write pulse (e.g., set operation) that is configured to transition the PCM cell from an amorphous state to a crystalline state. Approximately 90% of the PCM cells of graph 500B have a read disturb below 100 mV.

FIG. 5C includes a graph 500C depicting read disturb impact for a read operation with a setback pulse (e.g., shorter write pulse) that is $1/20^{th}$ of a regular write pulse (e.g., set operation) that is configured to transition the PCM cell from an amorphous state to a crystalline state. Approximately 100% of the PCM cells of graph 500C have a read disturb below 100 mV.

Figure 6A:
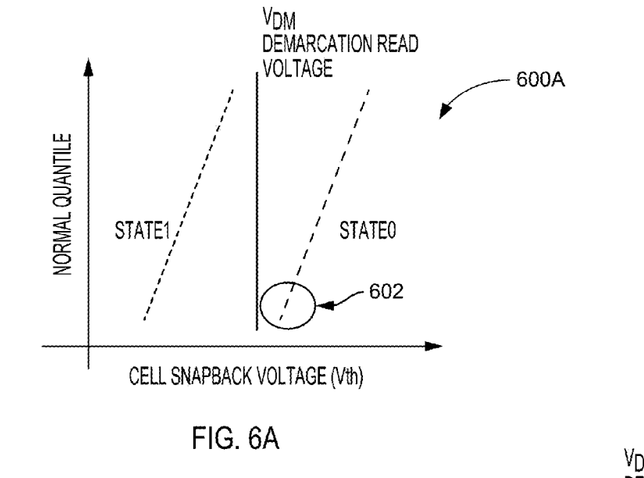
FIGS. 6A-B are graphs depicting disturb due to sub-threshold stress of setback pulse, in accordance with some embodiments.
Figure 6B:
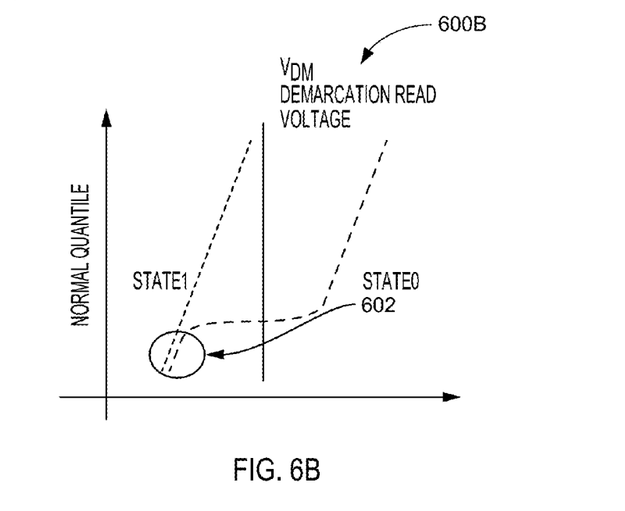

FIGS. 6A-B are graphs depicting disturb due to sub-threshold stress of setback pulse, in accordance with some embodiments. An example normal quantile of PCM cells is depicted on the vertical axis and cell snapback voltage (Vth) is depicted on the horizontal axis. The demarcation read voltage VDM is shown to distinguish PCM cells in a crystalline state (State1) from cells in an amorphous state (State0).

Graph 600A shows a case where there is a clear delineation at VDM for PCM cells in the crystalline state (State1) and the amorphous state (State0). The PCM cells 602 at a lower end of the distribution in the amorphous state are properly read as being in the amorphous state (State0). Referring to graph 600B, in some cases, the PCM cells 602 at the lower end of the distribution in the amorphous state (e.g., PCM cells 602) may be disturbed (e.g., sub-threshold disturb) below the VDM after several reads, and will be set back to the crystalline state (State1). In order to mitigate this effect, a shorter pulsewidth (e.g., shorter time) may be used (e.g., less than $1/20^{th}$ of regular write pulse) for the setback pulse. A longer pulsewidth of the setback pulse may increase the undesirable effect of sub-threshold disturb for the PCM cells 602 at the lower end of the distribution.

Figure 7:
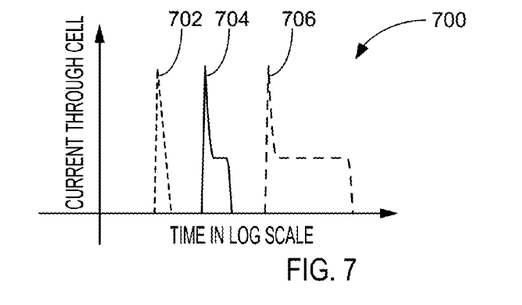
FIG. 7 is a graph depicting current profiles for regular read, integrated setback read and regular write pulses, in accordance with some embodiments.

FIG. 7 is a graph 700 depicting current profiles for regular read pulse 702, integrated setback read pulse 704 and regular write pulse 706, in accordance with some embodiments. A current through the PCM cell is depicted on the vertical axis and time in log scale is depicted on the horizontal axis.

As can be seen, a pulsewidth of the profile for the integrated setback read 704 is greater than a pulsewidth of the profile for the regular read pulse 702 and smaller than a pulsewidth of the profile for the regular write pulse 706. The profile of the integrated setback read 704 may include a period of constant current, as can been seen.

Figure 8:
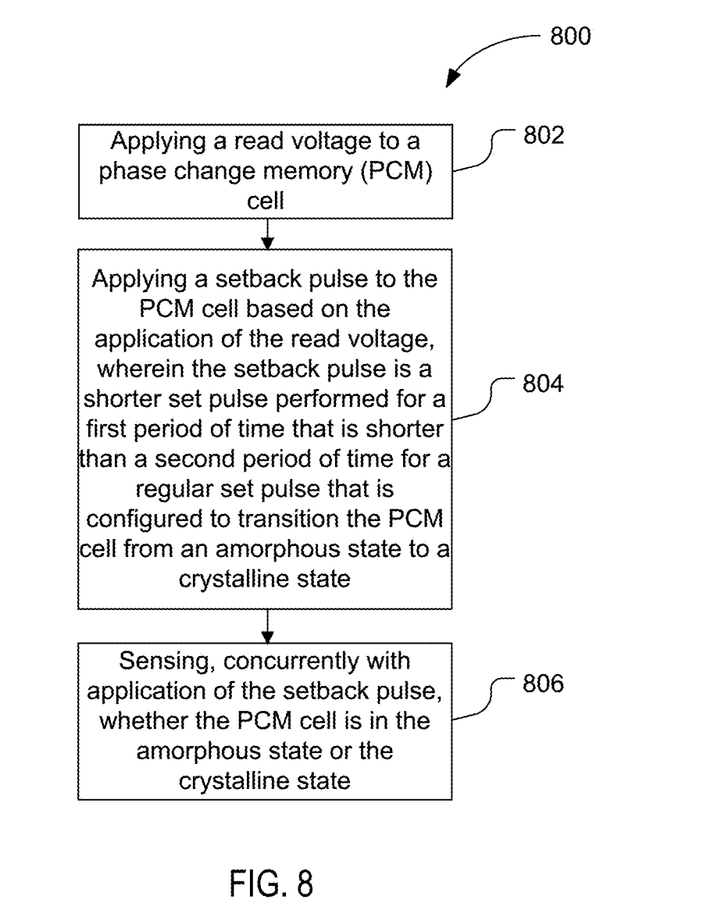
FIG. 8 is a flow diagram of a method for performing an integrated setback read to reduce snapback disturb, in accordance with some embodiments.

FIG. 8 is a flow diagram of a method 800 for performing an integrated setback read to reduce snapback disturb, in accordance with some embodiments. For example, the method 800 may include performing a short write pulse (e.g., a setback pulse) during a read operation to set back a PCM cell. The method 800 may comport with embodiments described in connection with FIGS. 1-7 and vice versa.

At 802, the method 800 may include applying a read voltage to a PCM cell. Application of the read voltage may comport with embodiments described in connection with FIG. 4. For example, in some embodiments, a read operation may be performed by applying a read voltage (e.g., VDM of FIG. 6A) to the PCM cell. If the PCM cell is in the crystalline state, the read voltage will be enough to turn on the PCM cell (e.g., snap back will occur). If the PCM cell is in the amorphous state, the read voltage will not be enough to turn on the PCM cell and such PCM cell may not see or receive a setback pulse. Snap back discharge effects on the PCM cell may be reduced during actions at 802 or 804 by using a transistor (e.g., transistor 204 of FIG. 2) coupled with the PCM cell to reduce or isolate capacitance discharge from disturbing the PCM cell when the PCM cell turns on in response to application of the read voltage.

At 804, the method 800 may include applying a setback pulse to the PCM cell based on the application of the read voltage, wherein the setback pulse is a shorter pulse performed for a first period of time that is shorter than a second period of time for a regular set pulse that is configured to transition the PCM cell from an amorphous state to a crystalline state. For example, a regular write pulse of a PCM cell may include a regular reset pulse to transition a PCM cell from crystalline state (State1) to amorphous state (State0), which may be a relatively shorter pulse than a regular set pulse but with higher current to heat the PCM cell above its melting current and quench to amorphize the PCM cell, or a regular set pulse to transition a PCM cell from amorphous state (State0) to crystalline state (State1), which may be relatively longer pulse than the regular reset pulse but with lower current to allow the PCM cell time to crystallize. The setback pulse may be a shorter version of the regular set pulse to setback the PCM cell (e.g., erase unwanted programming caused by the snapback discharge, which is a short high current event that may disturb the PCM cell from crystalline state).

In some embodiments, the first period of time may be $\frac{1}{100}^{th}$ of the second period of time or greater. The first period of time may be longer or shorter than $\frac{1}{100}^{th}$ of the second period according to various embodiments. In some embodiments, the first period of time may be $\frac{1}{20}^{th}$ of the second period of time or less in order to increase setback time and, accordingly, reduce disturb of PCM cells in the amorphous state (State0) as described in connection with FIGS. 6A-B.

According to some embodiments, the setback pulse may be performed during the read operation. For example, the setback pulse may be applied during application of the read voltage to turn on the PCM cell. In some embodiments, the setback pulse may be applied in response to the PCM cell turning on based on application of the read voltage. The setback pulse may be applied subsequent to or simultaneously with the PCM cell turning on in response to application of the read voltage and prior to the PCM cell turning off. In some embodiments, the setback pulse may be automatically applied to all PCM cells that threshold (snap) during application of the read pulse (e.g., PCM cells having a threshold voltage that is less than VDM, in the crystalline state). In some embodiments, the setback pulse may be applied by controlling a current applied to the PCM cell from the current source 218 of FIG. 2 using a current mirror. In some embodiments, the setback pulse may be applied during the entire period of time corresponding with the shaded region 406 depicted in FIG. 4.

In some embodiments, a setback current through the PCM cell may be limited or controlled (e.g., reduced) when the write pulse is performed. The setback current may be controlled, for example, according to techniques described in connection with FIG. 2.

At 806, the method 800 may include sensing, concurrently with application of the setback pulse, whether the PCM cell is in the amorphous state or the crystalline state. In some embodiments, sensing may be part of performing the read operation. In some embodiments, sensing may be performed subsequent to or simultaneously with the PCM cell turning on in response to application of the read voltage and prior to the PCM cell turning off. For example, the PCM cell may turn on at the beginning of the shaded portion 406 and turn off at the end of the shaded portion 406 of FIG. 4. Sensing may be performed by sensing the HNREG node of FIG. 2. In some embodiments, sensing may include sensing a voltage of the HNREG node by an amplifier to detect whether a target PCM cell is in crystalline or amorphous state.

Integrating a short write pulse (setback pulse) into the read pulse may have a variety of benefits. The setback pulse may write back the data of the PCM to state 1 (crystalline state) while reducing a current spike due to snapback discharge by isolating a majority of circuit capacitance, which may otherwise exacerbate the current spike and cause more disturb. The scheme of integrating the setback pulse into the read pulse may set back a PCM cell that is partially programmed by a discharge spike. The sensing may be performed during the read pulse to reduce latency of the read operation as opposed to performing sensing after termination of the read pulse. A slow ramp down quench of the integrated setback read may allow reduction of a pulsewidth of the setback pulse to further reduce latency. Read latency may be further reduced by transferring the data out of the PCM cell as soon as the PCM cell thresholds while concurrently applying the setback pulse.

Figure 9:
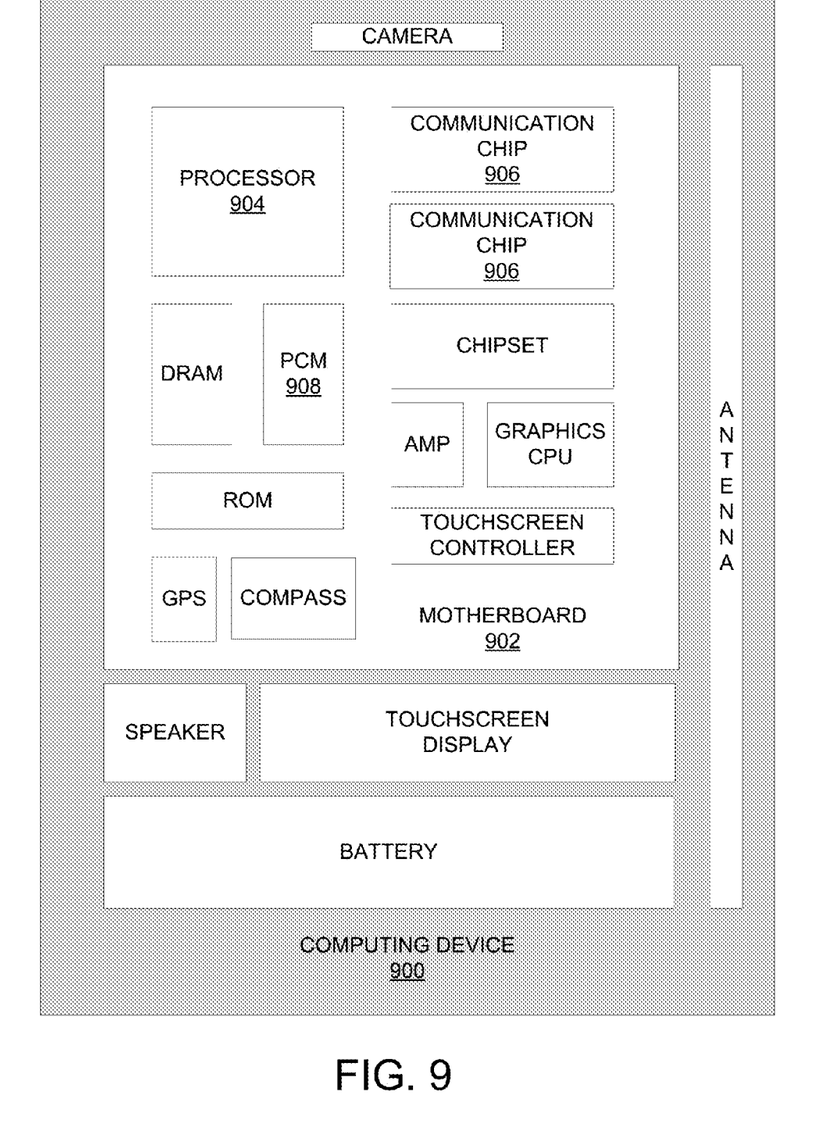
FIG. 9 schematically illustrates an example system that includes a PCM device having circuitry configured to perform actions in accordance with various embodiments described herein.

Embodiments of the present disclosure may be implemented into a system using any suitable hardware and/or software to configure as desired. FIG. 9 schematically illustrates an example system (e.g., computing device 900) that includes a PCM 908 having circuitry (e.g., circuitry 100 or 200 of FIG. 1 or 2) configured to perform actions in accordance with various embodiments described herein. The PCM 908 may be embodied, for example, in a die. The computing device 900 may house a board such as motherboard 902. The motherboard 902 may include a number of components, including but not limited to a processor 904 and at least one communication chip 906. The processor 904 may be physically and electrically coupled to the motherboard 902. In some implementations, the at least one communication chip 906 may also be physically and electrically coupled to the motherboard 902. In further implementations, the communication chip 906 may be part of the processor 904.

Depending on its applications, computing device 900 may include other components that may or may not be physically and electrically coupled to the motherboard 902. These other components may include, but are not limited to, volatile memory (e.g., DRAM), non-volatile memory (e.g., phase change memory (PCM 908) or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 908 may include circuitry (e.g., circuitry 100 or 200 of FIG. 1 or 2) that is configured to perform actions (e.g., method 800 of FIG. 8) described herein. For example, the PCM 908 may be configured to perform a read operation and an integrated setback pulse during the read operation to reduce snapback disturb.

The communication chip 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 906 may operate in accordance with other wireless protocols in other embodiments.

The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, EV-DO, and others.

In various implementations, the computing device 900 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

EXAMPLES

According to various embodiments, the present disclosure describes an apparatus. Example 1 of an apparatus may include read circuitry to apply a read voltage to a phase change memory (PCM) cell, setback circuitry to apply a setback pulse to the PCM cell in response to the application of the read voltage, wherein the setback pulse is a shorter set pulse performed for a first period of time that is shorter than a second period of time for a regular set pulse that is configured to transition the PCM cell from an amorphous state to a crystalline state, and sense circuitry to sense, concurrently with application of the setback pulse, whether the PCM cell is in the amorphous state or the crystalline state. Example 2 may include the apparatus of Example 1, wherein the first period of time is $1/100^{th}$ of the second period of time or greater. Example 3 may include the apparatus of Example 2, wherein the first period of time is $1/20^{th}$ of the second period of time or less. Example 4 may include the apparatus of Example 1, wherein the setback circuitry is configured to apply the setback pulse to the PCM cell based on the PCM cell turning on in response to application of the read voltage. Example 5 may include the apparatus of Example 4, wherein the PCM cell is in the crystalline state and wherein the sense circuitry is to sense whether the PCM cell is in the amorphous state or the crystalline state subsequent to or simultaneously with the PCM cell turning on in response to application of the read voltage and prior to the PCM cell turning off. Example 6 may include the apparatus of any of Examples 1-5, wherein the PCM cell is in the crystalline state and wherein the setback circuitry is to perform the setback pulse subsequent to or simultaneously with the PCM cell turning on in response to application of the read voltage and prior to the PCM cell turning off. Example 7 may include the apparatus of any of Examples 1-5, further comprising current-limiting circuitry to limit or control a setback current through the PCM cell when the setback pulse is performed. Example 8 may include the apparatus of any of Examples 1-5, further comprising a transistor coupled with the PCM cell to reduce or isolate capacitance discharge from disturbing the PCM cell when the PCM cell turns on in response to application of the read voltage.

According to various embodiments, the present disclosure describes a method. Example 9 of a method may include applying a read voltage to a phase change memory (PCM) cell, applying a setback pulse to the PCM cell in response to the application of the read voltage, wherein the setback pulse is a shorter set pulse performed for a first period of time that is shorter than a second period of time for a regular set pulse that is configured to transition the PCM cell from an amorphous state to a crystalline state, and sensing, concurrently with applying the setback pulse, whether the PCM cell is in the amorphous state or the crystalline state. Example 10 may include the method of Example 9, wherein the first period of time is $1/100^{th}$ of the second period of time or greater. Example 11 may include the method of Example 10, wherein the first period of time is $1/20^{th}$ of the second period of time or less. Example 12 may include the method of Example 9, wherein applying the setback pulse to the PCM cell is performed in response to the PCM cell turning on based on application of the read voltage. Example 13 may include the method of Example 12, wherein the PCM cell is in the crystalline state and wherein the sensing is performed subsequent to or simultaneously with the PCM cell turning on in response to application of the read voltage and prior to the PCM cell turning off. Example 14 may include the method of any of Examples 9-13, wherein the PCM cell is in the crystalline state and wherein the setback pulse is applied subsequent to or simultaneously with the PCM cell turning on in response to application of the read voltage and prior to the PCM cell turning off. Example 15 may include the method of any of Examples 9-13, further comprising limiting or controlling a setback current through the PCM cell when the setback pulse is performed.

According to various embodiments, the present disclosure describes a computer-readable medium having instructions stored thereon. Example 16 may include a computer-readable medium having instructions stored thereon, the instructions when executed by a processor cause circuitry to apply a read voltage to a phase change memory (PCM) cell, apply a setback pulse to the PCM cell in response to the application of the read voltage, wherein the setback pulse is a shorter set pulse performed for a first period of time that is shorter than a second period of time for a regular set pulse that is configured to transition the PCM cell from an amorphous state to a crystalline state, and sense, concurrently with application of the setback pulse, whether the PCM cell is in the amorphous state or the crystalline state. Example 17 may include the computer-readable medium of Example 16, wherein the first period of time is $1/100^{th}$ of the second period of time or greater. Example 18 may include the computer-readable medium of Example 17, wherein the first period of time is 1/20th of the second period of time or less. Example 19 may include the computer-readable medium of any of Examples 16-18, wherein the instructions when executed by a processor further cause circuitry to apply the setback during application of the read voltage.

According to various embodiments, the present disclosure describes a computing device. Example 20 of a computing device may include a circuit board and a die coupled with the circuit board, the die including read circuitry to apply a read voltage to a phase change memory (PCM) cell, setback circuitry to apply a setback pulse to the PCM cell in response to the application of the read voltage, wherein the setback pulse is a shorter set pulse performed for a first period of time that is shorter than a second period of time for a regular set pulse that is configured to transition the PCM cell from an amorphous state to a crystalline state, and sense circuitry to sense, concurrently with application of the setback pulse, whether the PCM cell is in the amorphous state or the crystalline state. Example 21 may include the computing device of Example 20, wherein the computing device is a mobile computing device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
    read circuitry, to apply a read voltage to a phase change memory (PCM) cell;
    setback circuitry coupled to the read circuitry, to apply a setback pulse to the PCM cell in response to the application of the read voltage, wherein the setback pulse is a shorter set pulse performed for a first period of time that is shorter than a second period of time for a regular set pulse that is to transition the PCM cell from an amorphous state to a crystalline state; and
    sense circuitry coupled to the setback circuitry, to sense, concurrently with application of the setback pulse, whether the PCM cell is in the amorphous state or the crystalline state.

2. The apparatus of claim 1, wherein the first period of time is 1/100th of the second period of time or greater.

3. The apparatus of claim 2, wherein the first period of time is 1/20th of the second period of time or less.

4. The apparatus of claim 1, wherein the setback circuitry is to apply the setback pulse to the PCM cell based on the PCM cell turning on in response to application of the read voltage.

5. The apparatus of claim 4, wherein the PCM cell is in the crystalline state and wherein the sense circuitry is to sense whether the PCM cell is in the amorphous state or the crystalline state subsequent to or simultaneously with the PCM cell turning on in response to application of the read voltage and prior to the PCM cell turning off.

6. The apparatus of claim 1, wherein the PCM cell is in the crystalline state and wherein the setback circuitry is to perform the setback pulse subsequent to or simultaneously with the PCM cell turning on in response to application of the read voltage and prior to the PCM cell turning off.

7. The apparatus of claim 1, further comprising:
    current-limiting circuitry to limit or control a setback current through the PCM cell when the setback pulse is performed.

8. The apparatus of claim 1, further comprising:
    a transistor coupled with the PCM cell to reduce or isolate capacitance discharge from disturbing the PCM cell when the PCM cell turns on in response to application of the read voltage.

9. A method comprising:
    applying a read voltage to a phase change memory (PCM) cell;
    applying a setback pulse to the PCM cell in response to the application of the read voltage, wherein the setback pulse is a shorter set pulse performed for a first period of time that is shorter than a second period of time for a regular set pulse that is to transition the PCM cell from an amorphous state to a crystalline state; and
    sensing, concurrently with applying the setback pulse, whether the PCM cell is in the amorphous state or the crystalline state.

10. The method of claim 9, wherein the first period of time is 1/100th of the second period of time or greater.

11. The method of claim 10, wherein the first period of time is 1/20th of the second period of time or less.

12. The method of claim 9, wherein applying the setback pulse to the PCM cell is performed in response to the PCM cell turning on based on application of the read voltage.

13. The method of claim 12, wherein the PCM cell is in the crystalline state and wherein the sensing is performed subsequent to or simultaneously with the PCM cell turning on in response to application of the read voltage and prior to the PCM cell turning off.

14. The method of claim 9, wherein the PCM cell is in the crystalline state and wherein the setback pulse is applied subsequent to or simultaneously with the PCM cell turning on in response to application of the read voltage and prior to the PCM cell turning off.

15. The method of claim 9, further comprising:
    limiting or controlling a setback current through the PCM cell when the setback pulse is performed.

16. A non-transitory computer-readable medium having instructions stored thereon, the instructions when executed by a processor cause circuitry to:
    apply a read voltage to a phase change memory (PCM) cell;
    apply a setback pulse to the PCM cell in response to the application of the read voltage, wherein the setback pulse is a shorter set pulse performed for a first period of time that is shorter than a second period of time for a regular set pulse that is to transition the PCM cell from an amorphous state to a crystalline state; and sense, concurrently with application of the setback pulse, whether the PCM cell is in the amorphous state or the crystalline state.

17. The non-transitory computer-readable medium of claim 16, wherein the first period of time is $1/100^{th}$ of the second period of time or greater.

18. The non-transitory computer-readable medium of claim 17, wherein the first period of time is $1/20^{th}$ of the second period of time or less.

19. The non-transitory computer-readable medium of claim 16, wherein the instructions when executed by a processor further cause circuitry to:

apply the setback pulse during application of the read voltage.

20. A computing device comprising:
a circuit board; and
a die coupled with the circuit board, the die including
   read circuitry to apply a read voltage to a phase change memory (PCM) cell;
   setback circuitry coupled to the read circuitry, to apply a setback pulse to the PCM cell in response to the application of the read voltage, wherein the setback pulse is a shorter set pulse performed for a first period of time that is shorter than a second period of time for a regular set pulse that is to transition the PCM cell from an amorphous state to a crystalline state; and
   sense circuitry coupled to the setback circuitry, to sense, concurrently with application of the setback pulse, whether the PCM cell is in the amorphous state or the crystalline state.

21. The computing device of claim 20, wherein the computing device is a mobile computing device.

* * * * *